(12) United States Patent
Quinones et al.

(10) Patent No.: US 8,278,932 B2
(45) Date of Patent: Oct. 2, 2012

(54) METHOD AND DETECTOR FOR DETERMINING A STATE OF A SWITCH

(75) Inventors: Bryan Quinones, Chandler, AZ (US); Randall C. Gray, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 458 days.

(21) Appl. No.: 12/621,238

(22) Filed: Nov. 18, 2009

(65) Prior Publication Data

US 2011/0115527 A1    May 19, 2011

(51) Int. Cl.
*G01R 31/02* (2006.01)
*G01R 31/327* (2006.01)
*H01H 47/00* (2006.01)

(52) U.S. Cl. .......................... 324/418; 324/415; 307/130
(58) Field of Classification Search .................. 324/418, 324/415

See application file for complete search history.

(56) References Cited

U.S. PATENT DOCUMENTS

| | | | |
|---|---|---|---|
| 5,488,323 A * | 1/1996 | Beacham et al. ................ 327/74 |
| 7,408,274 B2 * | 8/2008 | Sullivan et al. ............... 307/130 |
| 7,479,785 B2 * | 1/2009 | Liu et al. ........................ 324/415 |
| 7,557,583 B2 * | 7/2009 | Zettel et al. .................... 324/418 |
| 7,558,129 B2 | 7/2009 | Thorp et al. |
| 7,642,676 B2 * | 1/2010 | Washington .................. 307/130 |
| 7,746,054 B2 * | 6/2010 | Shuey ............................ 324/110 |

OTHER PUBLICATIONS

"Multiple Switch Detection Interface"; Advance Information Document No. MC33993; May 2008, Freescale Semiconductor, Inc.

* cited by examiner

*Primary Examiner* — Jeff Natalini
(74) *Attorney, Agent, or Firm* — Joanna G. Chiu; Daniel D. Hill

(57) ABSTRACT

In an integrated circuit, a state of a switch coupled to the integrated circuit is determined by comparing a switch voltage at a first terminal of the switch to a reference voltage at a first time. If the switch voltage is higher than the reference voltage, the switch is determined to be in a first state. If the switch voltage is lower than the reference voltage, the switch voltage is stored in a storage element to produce a stored voltage. The stored voltage is compared to the switch voltage at a second time after the first time. A determination is made that the switch is in the first state if the switch voltage is higher than the stored voltage at the second time. A determination is made that the switch is in a second state if the switch voltage is not higher than the stored voltage at the second time.

16 Claims, 2 Drawing Sheets

METHOD AND DETECTOR FOR DETERMINING A STATE OF A SWITCH

BACKGROUND

1. Field

This disclosure relates generally to semiconductors, and more specifically, to power usage in semiconductor detection circuits.

2. Related Art

Lower power consumption continues to have importance in data electronic systems, due, for example, to widespread use of electronics that are powered by batteries. Power conservation is not only particularly important for portable electronic devices, but is also important for automotive electronics which are also powered from a battery. To conserve power, many integrated circuits have a power saving feature commonly referred to as a sleep mode which is entered after a predetermined amount of circuit inactivity. In the sleep mode, the portions of the circuitry are powered down and thus are not fully functional. A minimum amount of circuit functionality however must remain. The circuitry which is necessary to be powered during a sleep mode of operation typically consumes a significant amount of power.

An example of an integrated circuit that has a sleep mode of operation is the MC33993 integrated circuit sold by Freescale Semiconductor. The MC33993 integrated circuit is designed to detect the closing and opening of up to twenty-two switch contacts. To detect the closing and opening of a switch contact, a comparator compares a predetermined constant reference voltage with a voltage of a capacitor coupled in parallel with the switch contact.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
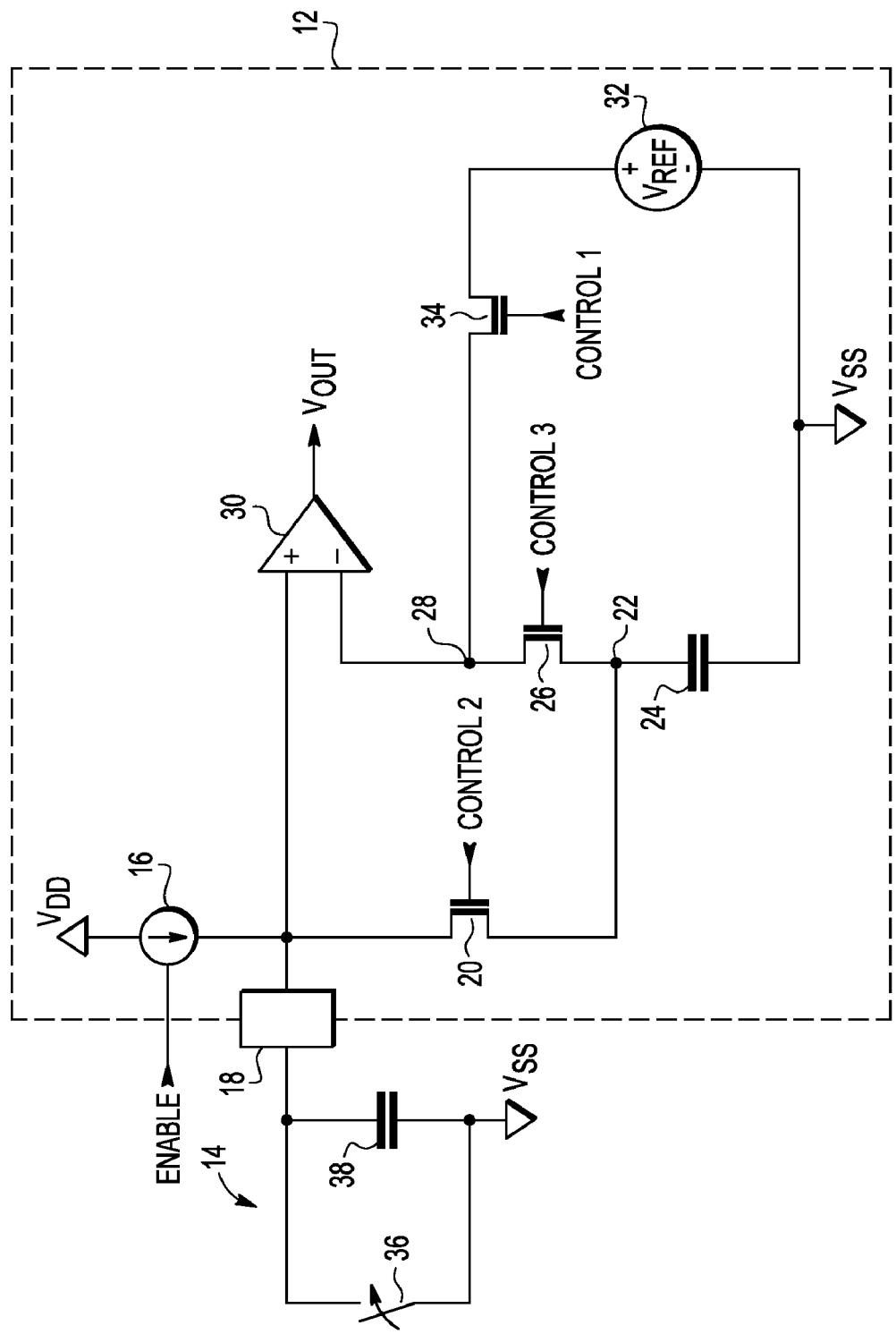
FIG. 1 illustrates in partial schematic diagram form a circuit for determining a state of a switch in accordance with the present invention.

In one embodiment FIG. 1 illustrates a circuit 10 for determining whether a switch is electrically closed or electrically open (i.e. an open circuit). In the illustrated form the circuit 10 has an integrated circuit 12 as designated by the dashed lines and external circuitry 14 that is external to the perimeter of the integrated circuit 12. Integrated circuit 12 has a current source 16 that has a first terminal connected to a first power supply voltage terminal labeled $V_{DD}$. A control terminal of current source 16 receives an enable signal. A second terminal of the current source 16 is connected to an input/output (I/O) terminal 18, to a drain of an N-channel transistor 20 and to a positive input of a comparator 30. A gate of transistor 20 is provided for receiving a control signal or bias signal labeled "Control 2". A source of transistor 20 is connected to a node 22. A capacitive element in the form of a capacitor 24 has a first terminal connected to node 22 and a second terminal connected to a second power supply voltage terminal labeled $V_{SS}$. In one form the $V_{SS}$ voltage is a ground voltage, but other voltage values may be used. In the illustrated form the voltage $V_{DD}$ has a higher potential than the voltage $V_{SS}$. An N-channel transistor 26 has a source connected to node 22, a gate for receiving a control signal labeled "Control 3" and a drain connected to a negative input of comparator 30 at a node 28. A reference voltage generator 32 for providing a reference voltage, $V_{REF}$, has a negative terminal connected to the $V_{SS}$ terminal and a positive terminal connected to a drain of an N-channel transistor 34. A gate of transistor 34 is provided for receiving a control signal labeled "Control 1". A source of transistor 34 is connected to node 28. The external circuitry 14 has a switch 36 having a first terminal connected to the $V_{SS}$ terminal and a second terminal connected to the input/output terminal 18. In one form switch 36 is a portion of a mechanical relay. Switch 36 is controlled by a control signal (not shown) that will make switch 36 either electrically conductive (i.e. closed) or electrically open circuited. A capacitor 38 has a first terminal connected to the $V_{SS}$ terminal and a second terminal connected to the input/output terminal 18. In one form capacitor 38 may represent a parasitic capacitance associated with the switch 36 and associated wiring and may not necessarily be implemented as a discrete capacitor. Also, switch 36 and capacitor 38 are implemented as components which are not contained within the integrated circuit 12. An output of comparator 30 provides a voltage labeled $V_{OUT}$. The illustrated portion of integrated circuit 12 is only a portion of circuitry contained in integrated circuit 12. Additional circuitry of integrated circuit 12 which is not included in FIG. 1 is unrelated to the present discussion and thus is not shown.

In operation, the integrated circuit 12 functions to determine a state of the switch 36 and provides an output voltage $V_{OUT}$ which has a value that indicates whether the voltage at input/output terminal 18 is greater than or less than a voltage applied to the negative input of comparator 30. The voltage that is applied to the negative input of comparator 30 is not a fixed value reference voltage. As a result, the integrated circuit 12 consumes an optimally small amount of power and quickly detects when the state of switch 36 changes during a low power mode of operation.

In one form the enable signal that is connected to current source 16 is asserted during a low power mode of operation (i.e. sleep mode or dozzy mode). However, the enable signal may also be asserted during normal operational modes. When the current source 16 is enabled, current is supplied to input/output terminal 18. Initially, both the Control 1 signal and the Control 2 signal are asserted and the Control 3 signal is not asserted. Therefore, transistors 20 and 34 are conductive and transistor 26 is nonconductive. If switch 36 is initially in a closed state, there is no voltage charging of either capacitor 38 or capacitor 24. By connecting the $V_{SS}$ voltage potential to input/output terminal 18, switch 36 is directly short circuiting each terminal of capacitors 24 and 38 to the same voltage. The $V_{SS}$ voltage is compared by comparator 30 with the positive reference voltage $V_{Ref}$ at a first point in time and a low output voltage is provided by comparator 30 indicating that the switch 36 is closed. In the same phase of a system clock of a system in which the illustrated circuitry of integrated circuit 12 is a part of, the value of the reference voltage is removed from node 28 by making transistor 34 nonconductive by de-asserting the Control 1 signal. A small amount of time is allowed to pass to make sure that the reference voltage has been removed from node 28. In the same phase of the system clock, the Control 3 signal is then asserted which connects node 22 to the negative input of comparator 30 at node 28. The negative input of comparator 30 starts to transition to $V_{SS}$ if switch 36 is still closed. By having both Control signal 2 and Control signal 3 conductive at the same time for a short time, the voltage transition at node 22 is not as significant and a more accurate voltage is maintained on capacitor 24 representative of the closed switch 36. After a small amount of time and in the same phase of the system clock, Control signal 2 is deasserted which removes node 22 from the input/output terminal 18. A small amount of charge exists on capacitor 24 from residual charge at node 28 placed as a result of the reference voltage generator 32 via transistor 34. This amount of charge represents a stored voltage within integrated circuit 12. The stored voltage on capacitor 24 is compared to the switch voltage which is the voltage on capacitor 38 as a result of the parallel switch 36 at a second point in time that is later than the first point in time. If switch 36 continues to remain closed, the output of comparator 30 remains the same logic value as when the reference voltage generator 32 was connected to the negative input of comparator 30 and switch 36 was closed. The integrated circuit 12 functions to continue to monitor the state of switch 36. If at some point in later time switch 36 becomes open or non-conductive, the current source 16 will charge capacitor 38. As capacitor 38 charges, the voltage at the positive input of comparator 30 increases and quickly exceeds the stored voltage on capacitor 24. The change in voltage at the positive input of comparator 30 will therefore quickly transition the logic state of the output of comparator 30 before a significant amount of current from current source 16 is required to charge capacitor 38. Once the VOUT of comparator 30 has changed its logic state, an indicator may be asserted by logic circuitry (not shown) or a controller (not shown) to indicate that the state of the switch 36 has changed. At this point such a controller may be configured to remove the Enable signal from current source 16 and save further power.

Figure 2:
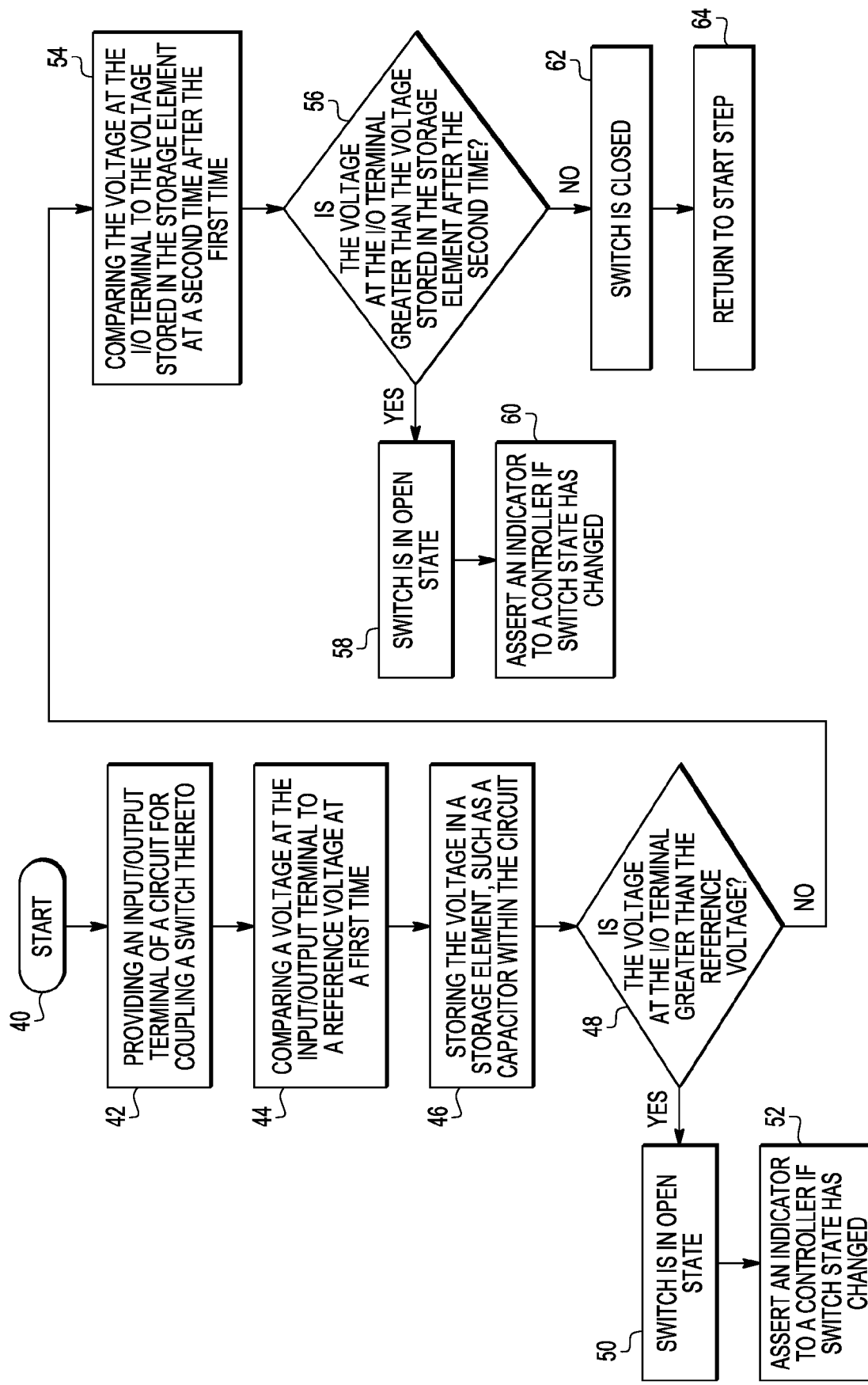
FIG. 2 illustrates in flow chart form a method for determining a state of a switch in accordance with the present invention.

Illustrated in FIG. 2 is a method which further illustrates the operation of circuit 10. After a start step 10, a switch is coupled to an input/output (I/O) terminal of circuit 10 in a step 42. In a step 44 a comparison is performed at a first point in time between a voltage at the input/output terminal and a reference voltage. The comparison may be implemented with a comparator or other circuitry which performs the compare function. The voltage which is being compared in step 44 is stored in step 46 in a storage element, such as a capacitor within the circuit 10. In the illustrated form of FIG. 1 the capacitor within the circuit 10 is capacitor 24. After step 46 a determination is made in a step 48 whether the voltage at the input/output terminal is greater in value (i.e. magnitude) than the reference voltage. If the answer to the determination in step 48 is "yes", a step 50 occurs in which it is determined that the switch associated with step 42 is in an open or non-conductive state. In an open state, a switch has very high impedance and thus the open state is sometimes also referred to as a high impedance state. Following step 50, a step 52 is performed wherein an indicator is asserted to a controller (not shown) if the switch state has changed. The indicator may take the form of a signal being asserted or a default value stored in a storage circuit which will indicate the changing of the switch state. If the state of the switch 36 has not changed, step 52 also functions to return the processing back to the start step 64. If the answer to the determination in step 48 is "no", a step 54 occurs in which a comparison of the voltage at the input/output terminal is made to the voltage stored in the storage element at a second point in time which is after or later in time than the first point in time. In one form the second time is in a range of, for example, between 10-20 microseconds after the first time. It should be understood that other time ranges may be implemented. In many forms with ten to twenty microseconds of time passage, there is adequate time for a switch state to affect the output of comparator 30 of FIG. 1. In response to the comparison of step 54, a determination is made in step 56 to determine whether the voltage at the input/output terminal is greater than the voltage stored in the storage element after the second point in time. If the answer to the determination in step 56 is "yes", a step 58 occurs in which it is determined that the switch 36 is in an open or nonconductive state. In a step 60, an indicator is asserted to a controller (not shown) to show or inform if the switch state has changed. It should be understood that step 60 is the same functionality as step 52 and may be implemented with the same circuitry or software executed by circuitry. If the switch state has changed from that previously stored, then the integrated circuit 12 may be woken in one exemplary form in order to respond to the change in switch state. In other examples, other responses may occur. If the state of the switch 36 has not changed, a step 64 functions to return the process back to the start step 40. If the answer to the determination in step 56 is "no", a step 62 is implemented in which a determination is made that the switch 36 is closed. If the switch state has changed from that previously stored, then the integrated circuit 12 may be woken in one example in order to respond to the change in switch state. In other examples, other responses may occur. If the state of the switch 36 has not changed, a step 64 functions to return the method analysis back to the start step 40.

By now it should be appreciated that there has been provided a method and circuitry for detecting an open state of a switch that is fast and which minimizes power. Rather than requiring a monitored voltage to transition beyond a predetermined fixed threshold voltage, a determination is made whether the voltage at the input/output terminal is increasing by using a comparison with a voltage at the negative input of comparator 30 that is not a non-varying reference voltage. Focusing on detecting a transition in the voltage at the input/output terminal 18 permits faster operation and less power consumption. By monitoring only a small change in voltage, the current used to charge the capacitor 24 can be significantly decreased and the time needed also reduced.

Because the various apparatus implementing the present invention are, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention. It should be understood that all circuitry described herein may be implemented either in silicon or another semiconductor material. During a manufacture process, the described circuitry may be instantiated by a software code representation of silicon or another semiconductor material.

In one form there is herein provided a method for determining a state of a switch. A switch voltage at a first terminal of the switch is compared to a reference voltage at a first time. If the switch voltage is higher than the reference voltage, a determination is made that the switch is in a first state. If the switch voltage is lower than the reference voltage, the switch voltage is stored in a storage element to produce a stored voltage. The stored voltage is compared to the switch voltage at a second time after the first time. A determination is made that the switch is in the first state if the switch voltage is higher than the stored voltage at the second time. A determination is made that the switch is in a second state if the switch voltage is not higher than the stored voltage at the second time. In one form the determination that the switch is in a first state further includes determining that the switch is in an open state. In another form the determination that the switch is in the second state further includes determining that the switch is in a closed state. In another form the storage element is a capacitive storage element. In yet another form the storage element is a capacitor. In a further form the switch is a portion of a mechanical relay. In another form the second time is in a range of between 10-20 microseconds after the first time. In another form the state of the switch is reported if the state of the switch has changed. In yet another form the state of the switch is reported as an interrupt if the state of the switch has changed.

In another form there is provided a method for determining a state of a switch in which a switch voltage at a first terminal of the switch is compared to a reference voltage at a first time. If the switch voltage is higher than the reference voltage, a determination is made that the switch is in an open state. If the switch voltage is lower than the reference voltage, the switch voltage is stored in a storage element to produce a stored voltage. The stored voltage is compared to the switch voltage at a second time after the first time. A determination is made that the switch is in the open state if the switch voltage is higher than the stored voltage at the second time. A determination is made that the switch is in a closed state if the switch voltage is not higher than the stored voltage at the second time. In another form the storage element is a capacitive storage element. In yet another form the storage element is a capacitor. In a further form the switch is a portion of a mechanical relay. In another form the second time is in a range of between 10-20 microseconds after the first time. In another form the state of the switch is reported to a controller circuit if the state of the switch has changed. In another form the state of the switch is reported as an interrupt if the state of the switch has changed.

In another form there is provided a circuit having an input/output terminal. A current source has a first terminal coupled to a first power supply voltage terminal, and a second terminal coupled to the input/output terminal. A comparator has a first input terminal coupled to the input/output terminal, a second input terminal, and an output terminal. A first transistor has a first current electrode coupled to the second input terminal of the comparator, a second current electrode coupled to receive a reference voltage, and a control electrode for receiving a first control signal. A second transistor has a first current electrode coupled to the first input terminal of the comparator, a second current electrode, and a control electrode for receiving a second control signal. A capacitive element has a first electrode coupled to the second current electrode of the second transistor, and a second electrode coupled to a second power supply voltage terminal. A third transistor has a first current electrode coupled to the second input terminal of the comparator, a second current electrode coupled to the first electrode of the capacitive element, and a control electrode for receiving a third control signal. In another form the circuit further has a switch having a first terminal coupled to the input/output terminal, and a second terminal coupled to the second power supply voltage terminal and the circuit is for detecting a state of the switch. A capacitor has a first plate electrode coupled to the first terminal of the switch, and a second plate electrode coupled to the second terminal of the switch. In another form the comparator provides an output signal in response to detecting that the switch is in an open state. In another form the circuit is implemented on an integrated circuit, and the switch and capacitor are external to the integrated circuit.

Some of the above embodiments, as applicable, may be implemented using a variety of different information processing systems. For example, various semiconductor capacitor structures may be used to implement the described circuitry. The circuit 10 is implemented independent of the type of semiconductor manufacturing process. The current source and voltage source which provides a reference voltage may be implemented with various circuit implementations known to provide these functions. Circuit details of the comparator 30 circuit is not provided as differing known comparator circuits may be implemented to perform the describe compare function.

Although the invention is described herein with reference to specific embodiments, various modifications and changes can be made without departing from the scope of the present invention as set forth in the claims below. Thus, it is to be understood that the circuitry depicted herein is merely exemplary, and that in fact other circuit elements can be implemented which achieve the described functionality. Any arrangement of components to achieve the same functionality is effectively "associated" such that the desired functionality is achieved. Hence, any two components herein combined to achieve a particular functionality can be seen as "associated with" each other such that the desired functionality is achieved. Likewise, any two components so associated can also be viewed as being "operably connected," or "operably coupled," to each other to achieve the desired functionality.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A method for determining a state of a switch, the method comprising:
   comparing a switch voltage at a first terminal of the switch to a reference voltage at a first time;
   if the switch voltage is higher than the reference voltage, determining that the switch is in a first state;
   if the switch voltage is lower than the reference voltage, storing the switch voltage in a storage element to produce a stored voltage;
   comparing the stored voltage to the switch voltage at a second time after the first time;
   determining that the switch is in the first state if the switch voltage is higher than the stored voltage at the second time; and
   determining that the switch is in a second state if the switch voltage is not higher than the stored voltage at the second time.

2. The method of claim 1, wherein determining that the switch is in a first state further comprises determining that the switch is in an open state.

3. The method of claim 1, wherein determining that the switch is the second state further comprises determining that the switch is in a closed state.

4. The method of claim 1, wherein the storage element is characterized as being a capacitive storage element.

5. The method of claim 1, wherein the storage element is a capacitor.

6. The method of claim 1, wherein the switch is a portion of a mechanical relay.

7. The method of claim 1, wherein the second time is in a range of between 10-20 microseconds after the first time.

8. The method of claim 1, further comprising reporting the state of the switch if the state of the switch has changed.

9. The method of claim 8, wherein the state of the switch is reported as an interrupt if the state of the switch has changed.

10. A method for determining a state of a switch, the method comprising:
    comparing a switch voltage at a first terminal of the switch to a reference voltage at a first time;
    if the switch voltage is higher than the reference voltage, determining that the switch is in an open state;
    if the switch voltage is lower than the reference voltage, storing the switch voltage in a storage element to produce a stored voltage;
    comparing the stored voltage to the switch voltage at a second time after the first time;
    determining that the switch is in the open state if the switch voltage is higher than the stored voltage at the second time; and
    determining that the switch is in a closed state if the switch voltage is not higher than the stored voltage at the second time.

11. The method of claim 10, wherein the storage element is characterized as being a capacitive storage element.

12. The method of claim 10, wherein the storage element is a capacitor.

13. The method of claim 10, wherein the switch is a portion of a mechanical relay.

14. The method of claim 10, wherein the second time is in a range of between 10-20 microseconds after the first time.

15. The method of claim 10, further comprising reporting the state of the switch to a controller circuit if the state of the switch has changed.

16. The method of claim 15, wherein the state of the switch is reported as an interrupt if the state of the switch has changed.

* * * * *